(12) United States Patent
Chang et al.

(10) Patent No.: US 7,609,096 B1
(45) Date of Patent: Oct. 27, 2009

(54) FREQUENCY SYNTHESIZER AND METHOD FOR CONSTRUCTING THE SAME

(76) Inventors: Edward C. Chang, 863 26th Ave., San Francisco, CA (US) 94121; Deirdre McGlashan, 863 26th Ave., San Francisco, CA (US) 94121; Meimei Chang, 863 26th Ave., San Francisco, CA (US) 94121

( * ) Notice: Subject to any disclaimer, the term of this patent is extended or adjusted under 35 U.S.C. 154(b) by 0 days.

(21) Appl. No.: 12/138,936

(22) Filed: Jun. 13, 2008

(51) Int. Cl.
*H03B 21/00* (2006.01)
(52) U.S. Cl. ...................................... 327/107
(58) Field of Classification Search .................. 327/107
See application file for complete search history.

(56) References Cited

U.S. PATENT DOCUMENTS 3,898,579 A * 8/1975 Aldridge ..................... 331/1 A
3,913,028 A * 10/1975 Bosselaers .................. 331/1 A

* cited by examiner

*Primary Examiner*—Lincoln Donovan
*Assistant Examiner*—William Hernandez
(74) *Attorney, Agent, or Firm*—Birch, Stewart, Kolasch & Birch, LLP

(57) ABSTRACT

A frequency synthesizer and a method for constructing the same by using the architecture of digital process frequency loop (DPFL) are disclosed. The DPFL frequency synthesizer with the DPFL architecture includes a reference frequency divider counter, an output divider counter, a processor, a memory, a digital to analog converter (DAC), and a voltage Control Oscillator (VCO). The method uses the processor to perform the signal processing to correct the output frequency of the VCO in the frequency domain. The memory stores the nonlinear characteristics of the VCO such that the synthesizer is completely controlled, no uncertain frequency being captured during process, and the frequency resolution of the synthesizer is programmable.

25 Claims, 8 Drawing Sheets

FREQUENCY SYNTHESIZER AND METHOD FOR CONSTRUCTING THE SAME

BACKGROUND OF THE INVENTION

1. Field of the Invention

The present invention relates generally to a frequency synthesizer, and more particularly, to a method for using the architecture of digital process frequency loop (DPFL) with a processor and a DAC (Digital to Analog Converter) to construct an electronic frequency synthesizer.

2. The Prior Arts

The frequency synthesizer has been widely used to generate the target frequency corresponding to system requirement in many electronic applications for years. One of the most common frequency synthesizers is the PLL frequency synthesizer, in which the PLL includes a phase detector and a charge pump or a low pass filter. As well known, the PLL frequency synthesizer in the prior arts was invented in the 1930s.

With reference to FIG. 1, the block diagram of the PLL frequency synthesizer shows that the synthesizer includes a frequency divider 1, a phase detector 2, a low pass filter/charge pump 3, a voltage control oscillator (VCO) 4 and an output frequency divider 5. The synthesizer has a reference frequency $f_{REF}$ as an input signal, which is quite stable. The characteristic of the VCO 4 is that the output frequency $f_O$ of the VCO will change when the input voltage of the VCO changes, as shown in FIG. 4.

The reference frequency with high stability is fed straight to one input of the phase detector 2 or fed through the frequency divider 1 that divides down the reference frequency before it feeds to the input of the phase detector 2. Another frequency that is generated from the VCO 4 of the frequency synthesizer also is divided down by the output frequency divider 5 and feeds into another input of the phase detector 2.

The function of the phase detector 2 is to generate a voltage in proportion to the amount of the phase difference between the two inputs of the phase detector 2, when the reference frequency is leading or lagging. The generated voltage then passes through a low pass filter/charge pump 3 to steer the VCO 4 to a frequency that will make the two input signals in phase at the input of the phase detector 2. As a result, the output frequency of the VCO 4 is said to lock on to the reference frequency. The phase detector 2 has no output voltage when the two signals are in phase. It relies on the charge pump 3 to maintain the input voltage of the VCO 4. The charge pump 3 will lose its voltage because of the leakage current that causes the VCO 4 to change its frequency until the phase difference is large enough for the phase detector 3 to realize the difference and start to provide the corresponding voltage to the charge pump 3 to bring it back to the targeted frequency.

There are two drawbacks in the traditional PLL frequency synthesizer. Firstly, the PLL frequency synthesizer has two variables to deal with, including the frequency and the phase. As well known, the phase difference obtained by the phase detector does not have any information about the frequency or vice versa. Secondly, the VCO starts to react to the voltage when the charge pump is charging. The output frequency divider is continuously counting. Some unwanted frequencies will be unwontedly captured. These unwontedly captured frequencies become smaller and smaller as the output frequency gets closer to the final frequency. It will take several tries to lock.

SUMMARY OF THE INVENTION

A primary objective of the present invention is to provide a method and an apparatus for constructing a frequency synthesizer to overcome the shortcomings in the prior arts. The innovative DPFL of the present invention is used to build an electronic frequency synthesizer. The method uses a time base counter, a frequency counter, a processor, and a DAC, instead of a phase detector in PLL architecture. With digital processing technique, the frequency counter corrects the VCO output in the specified frequency domain. Furthermore, there is no phase relationship between the reference frequency and the output frequency.

Another objective of the present invention is to provide a method and an apparatus for building the DPFL frequency synthesizer with a memory to store the nonlinearity characteristics of the VCO. The DPFL frequency synthesizer first searches all the corresponding values for the DAC to drive the VCO to generate the target frequency within the range of the target frequency. Each value is stored in the memory with the address as value of the target frequency.

A still another objective of the present invention is to provide a method and an apparatus for constructing a DPFL frequency synthesizer with a smaller memory. The DPFL frequency synthesizer includes a coarse memory, a coarse DAC, a vernier memory, a vernier DAC, and a summation amplifier. The LSB voltage of the coarse DAC equals to the full scale of the vernier DAC minus one LSB such that the memory size is greatly reduced.

A yet another objective of the present invention is to provide a method and an apparatus for constructing a DPFL frequency synthesizer, which searches and stores the VCO transfer characteristic, the VCO settling time, and the frequency sustain time of the VCO in advance, and then that stored data is processed by digital processing technique such that all the characteristics of the synthesizer are well known and completely controlled so as to reach the targeted frequency faster. Moreover, better frequency resolution is obtained and signal noise introduced by digital parts can be minimized by closing the counter for a period of the frequency sustain time.

The foregoing and other objectives, features, and advantages of the invention will become apparent from the following, more specific, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

DETAILED DESCRIPTION OF THE PREFERRED EMBODIMENTS

The method of the present invention constructs a DPFL frequency Synthesizer with a processor and a DAC to replace the phase detector and the low pass filter/charge pump of the prior arts.

Figure 1:
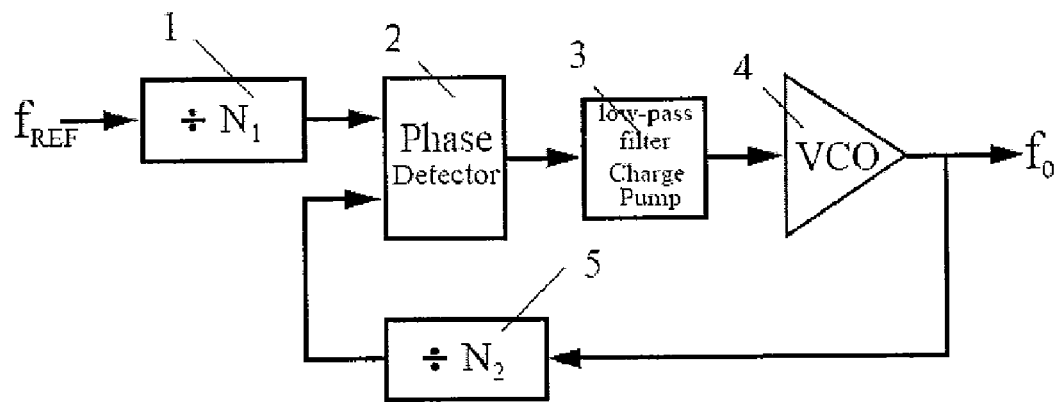
FIG. 1 is a functional block diagram of a PLL frequency Synthesizer according to the prior arts.
Figure 2:
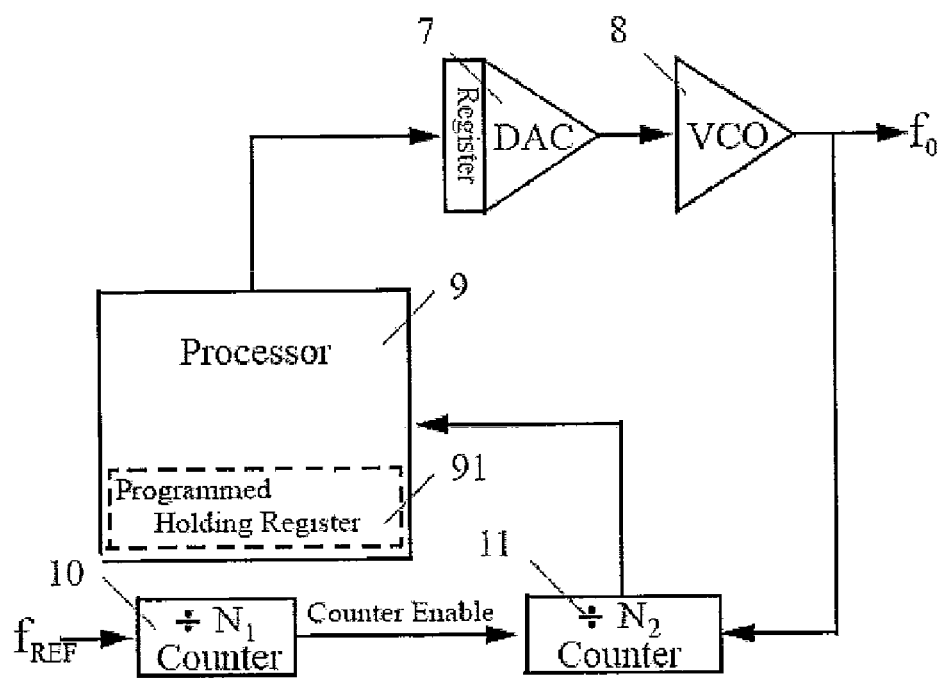
FIG. 2 is a functional block diagram of a DPFL frequency Synthesizer according to the first embodiment of the present invention.
Figure 2A:
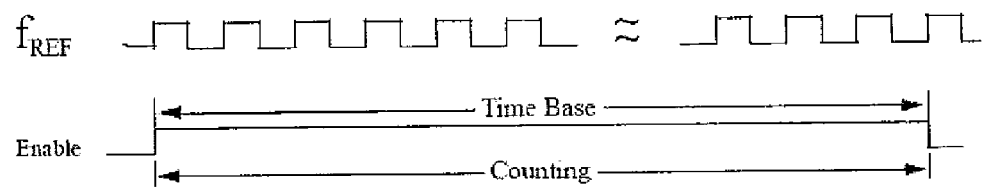
FIG. 2A is a waveform to illustrate the time base enable signal generated from $f_{REF}$ in DPFL frequency Synthesizer according to the first embodiment of the present invention.

With reference to FIG. 2, the functional block diagram of the DPFL frequency Synthesizer of the first embodiment according to the present invention is shown. The DPFL frequency Synthesizer includes an N1 counter 10, an N2 counter 11, a processor 9, a DAC 7, and a VCO 8. The function of the DPFL frequency Synthesizer is to generate an accurate and specified frequency $f_O$ based on an stable input reference frequency $f_{REF}$, as shown in FIG. 2.

The "time base" N1 counter 10 is either a fixed value counter or a programmable counter. The N2 counter 11 counts the output frequency of VCO 8. Since the time base derives from N1 counter 10 with respect to $f_{REF}$, the measured frequency by the N2 counter 11 is fairly accurate. The measured frequency is sent to the processor 9.

Figure 3:
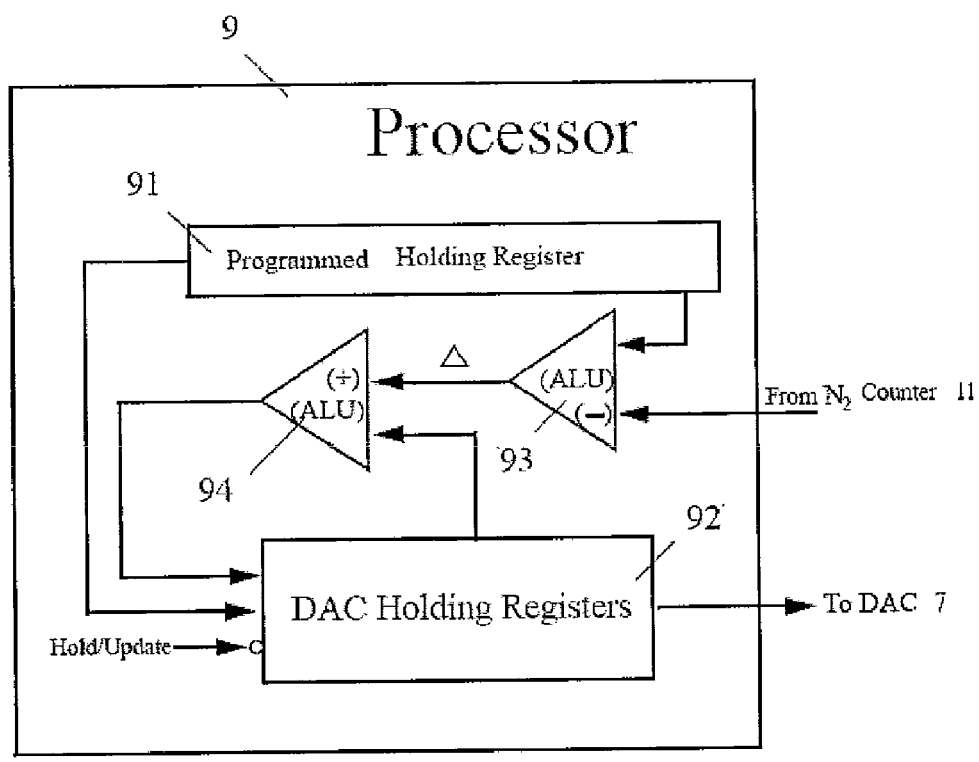
FIG. 3 is a functional block diagram of the processor in FIG. 2 according to the present invention.

FIG. 3 is the block diagram of the processor 9. The processor 9 includes a programmed holding register 91, a DAC holding register 92, a first arithmetic logic unit (ALU) 93, and a second ALU 94. The programmed holding register 91 stores the value of the programmed target frequency, which is specified by a control device, such as the processor or the computer. The measured frequency by the N2 counter 11 is subtracted from the programmed holding register 91 by the first ALU 93 and then the subtracted result is added to the value in the DAC holding register 92 by the second ALU 94. The second ALU 94 sends the added value back to the DAC holding register 92, and then the DAC holding register 92 transfers the updated value to the register in the DAC 7.

The DAC holding register 92 has 3 input ports, including the Hold/Update port, the first input data port, and the second input data port. The first input data port is connected to the output port of the second ALU 94, and the second input data port is connected to the output port of the programmed holding register 91. The fold/Update port switches the DAC holding register 92 to the Hold or Update modes. In the Hold mode, the DAC holding register 92 will hold the output data sent to the DAC 7 regardless of any change at the first and second input data ports.

In the Update mode, the DAC holding register 92 will update the output data with respect to the first and second input data. The second input data port is updated only when a new value is written to the programmed holding register 91 by the system, such as the computer or processor.

Figure 4:
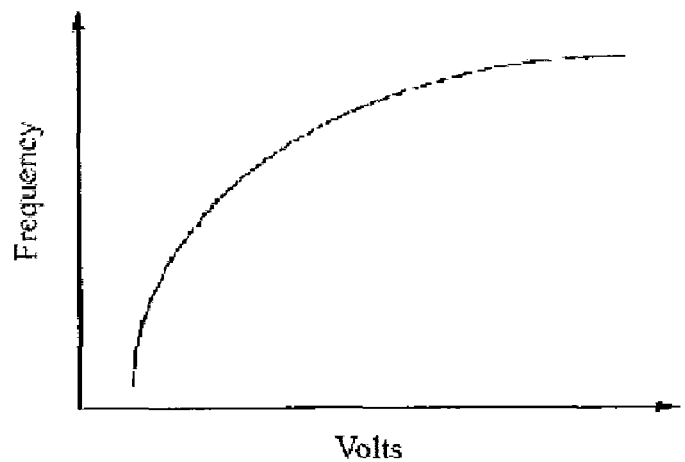
FIG. 4 is a transfer characteristic diagram of the voltage and frequency of the VCO.

If the subtracted result is a positive number, the output frequency of the VCO 8 is lower than the target frequency. As shown in FIG. 4, the voltage for the DAC 7 needs to be increased to bring up the output frequency of the VCO 8. The second ALU 94 obtains a new data by adding the output data of the DAC holding register 92 and the subtracted result from the first ALU 93. The new data sent back to the DAC holding register 92 is larger than the previous data transferred from the programmed holding register 91.

The measured result from the N2 counter 11 always needs to compare with the value in the programmed holding register 91 to check whether the output frequency of the VCO 8 reaches the target frequency or not.

Now the output voltage of the DAC 7 is increased because the output data from the DAC holding register 92 is updated by the new larger value. Thus, the VCO 8 starts to increase the output frequency. After the output frequency of the VCO 8 is settled, the N2 counter 11 begins the frequency measurement again. The result of the N2 counter 11 is subtracted from the holding register 91 by the first ALU 93. This time if the subtracted result is a negative number, that means the output frequency of the VCO 8 is higher than the target frequency. The negative number is then added to the DAC holding register 92 again by the second ALU 94. Consequently, the DAC holding register 92 obtains an updated smaller data. As a result, the DAC 7 decreases its voltage and causes the VCO 8 to reduce the output frequency.

The above process repeats until the measured value of the N2 counter 11 matches the value in the programmed holding register 91. This means that the output frequency of the VCO 8 reaches the target frequency as desired. The N2 counter 11 has a value equal to the value in the programmed holding register 91 and the difference of the subtraction is zero. Therefore the DAC holding register 92 will not change the stored value because a zero is always added to the DAC holding register 92. Once the output frequency of the VCO 8 drifts off due to any reason, the search process as mentioned above begins again to correct the output frequency of the VCO 8 to match the target frequency.

Since the DPFL technique does not use the phase detector, the output frequency of the synthesizer does not have any phase relationship with the reference frequency.

As shown in FIG. 4, the transfer characteristic of the voltage and frequency of the VCO 8 is a nonlinear function. However, the values in the programmed holding register 91 and DAC holding register 92 are linear. It is desired to compensate the nonlinearity of the VCO.

Figure 5:
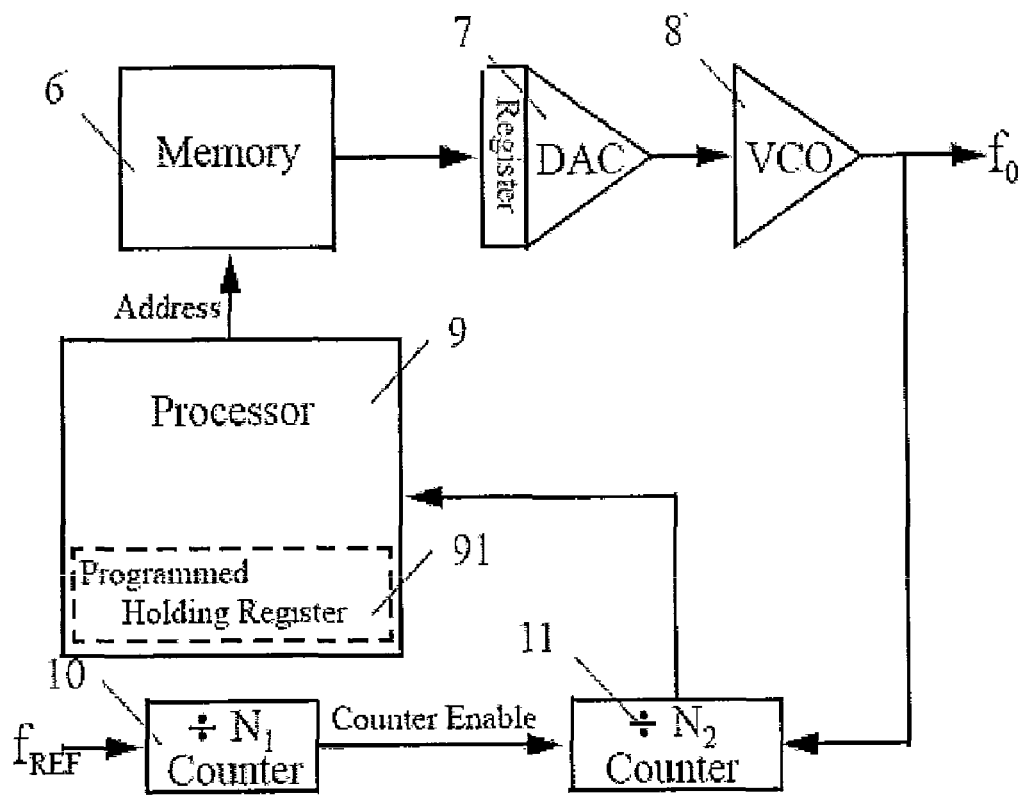
FIG. 5 is a functional block diagram of a DPFL frequency Synthesizer according to the second embodiment of the present invention.

With reference to FIG. 5, the second embodiment according to the present invention includes a memory, ROM or nonvolatile memory 6 in the DPFL synthesizer, which is used to perform translation of the linear function elements to the nonlinear function element of the VCO as mentioned above.

To clearly explain the function of the memory 6 in the DPFL frequency synthesizer of the second embodiment according to the present invention, assume that the synthesizer has a valid working range of 90 MHz to 100 MHz, which will be used throughout the entire text. Noted that this range is only an example for description and not limited to the present invention.

It also assumes that the following conditions are true and perfect:

(1) The programmed holding register 91 in FIG. 3 is 28 bits wide.

(2) Time base from the N1 counter 10 in FIG. 5 is 1 second for the purpose to have a resolution of 1 Hz.

(3) The N2 counter 11 in FIG. 5 also is 28 bits wide for having a resolution of 1 Hz.

(4) The first ALU 93 and the second ALU 94 in FIG. 3 are 28 bits wide.

(5) The DAC holding register 92 in FIG. 3 is 28 bits wide.

(6) The DAC register is 28 bits wide and the DAC 7 is 28 bits DAC in FIG. 5.

(7) The VCO 8 in FIG. 5 is stable to 1 Hz.

Consider all the values from 90 Mhz to 100 Mhz with 1 Hz increment for the following discussion, i.e., 90,000,001, 90,000,002, . . . , 100,000,000. The function of the memory 6 is to store the correct value for the DAC so as to drive the VCO to generate the target frequency as desired.

The Hold/Update port of the DAC holding register 92 in FIG. 3 is set in the Hold mode.

The value of the target frequency is programmed to the programmed holding register 91 and transferred to the DAC holding register 92. Since the DAC holding register 92 is in the HOLD mode, the output data of the DAC holding register 92 will not be updated. Initially, a suitable value is written to the DAC register to drive the VCO 8 to the vicinity of the target frequency by the system. After the VCO 8 is settled, the N2 counter 11 begins to measure the output frequency of the VCO 8. If the N2 counter 11 does not match the value in the programmed holding register 91, the DAC 7 will be loaded with a new value from the system, and the N2 counter 11 repeats the process of measurement as the above mention until the N2 counter 11 matches the value in programmed holding register 91. Now the value in the DAC 7 register is the right value for the target frequency. This value is read and then stored in the memory 6 with the value in the programmed holding register 91 as the memory address.

Sequentially the value in the DAC 7 is changed for another value as a new target frequency and the entire searching process repeats until all the correct values for the target frequencies from 90 MHz to 100 MHz are found and stored in the memory 6. Theoretically the frequency synthesizer should reach the target frequency the first time when the programmed holding register 91 is programmed.

Now the DAC holding register 92 is set in the Update mode, and the value of the target frequency of 100 MHz is loaded to the programmed holding register 91. The stored value of the programmed holding register 91 is transferred to the DAC holding register 92, which addresses the memory 6 to fetch the right value for the DAC 7 to drive the VCO 8 to generate 100 MHz as desired.

After a period of time for the VCO 8 to settle at 100 MHz, the value of the target frequency of 90 MHz is programmed to the programmed holding register 91. This is the worse case condition that the VCO has to settle to 90 MHz from 100 MHz.

The N2 counter 11 starts the frequency measurement immediately after the programmed holding register 91 is written before the VCO 8 is settled. The result of the measure is stored as RV1. It is anticipated that RV1 is not the targeted frequency because the VCO 8 is not yet settled when the N2 counter 11 starts. After RV1 is stored, the N2 counter 11 starts again for the second measurement. The result of the second measurement should be 90 MHz because the VCO 8 should be settled during the first measurement.

The same process is repeated from the beginning by setting the synthesizer to 100 MHz, waiting for it to settle, and then changing the targeted frequency to 90 MHz. This time we wait for 10 μs to start the N2 counter 11. Then the process repeats from the beginning and waits for 20 μs, 30 μs, . . . until 90 MHz is measured by the N2 counter 11. This is the VCO 9 settling time t1 as shown in FIG. 6.

Figure 6:
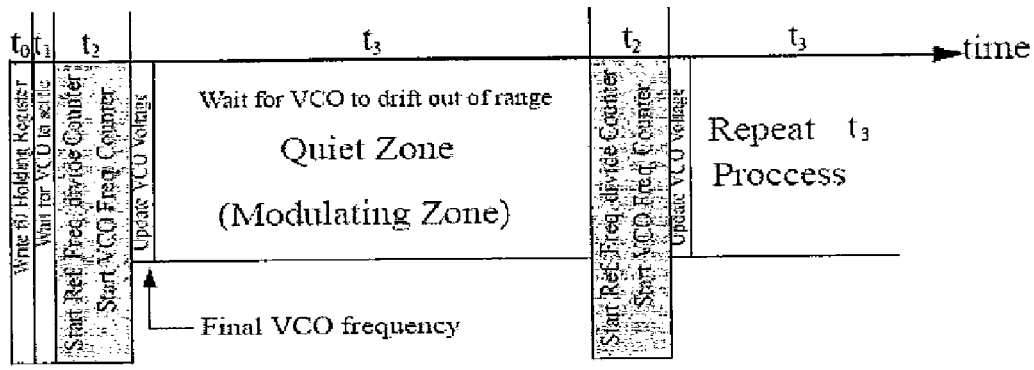
FIG. 6 shows the sequences of controlling the DPFL synthesizer according to the present invention.

Another important information is the frequency sustain time t3, as shown in FIG. 6. To find the frequency sustain time t3, a time delay is set by the computer or processor and then check the output frequency with the N2 counter 11. By increasing the delay time until the output frequency of the VCO 8 drifts off the specification, the sustain time t3 is found. The purpose of knowing the sustain time is to reduce the digital switching noise derived from the digital parts in the synthesizer, that is the output frequency can sustain for the sustain time and the N2 counter 11 may be turned off during the sustain time.

Another factor is the t2 time. It is under the control of the designer. It is pretty well determined by the resolution requirement for a particular synthesizer. Actually most of the applications do not require this kind of resolution.

The example using 1 Hz resolution shows that it is capable of achieving 1 Hz resolution theoretically. In fact to obtain a 1 Hz resolution at 100 MHz is extremely difficult.

Figure 7:
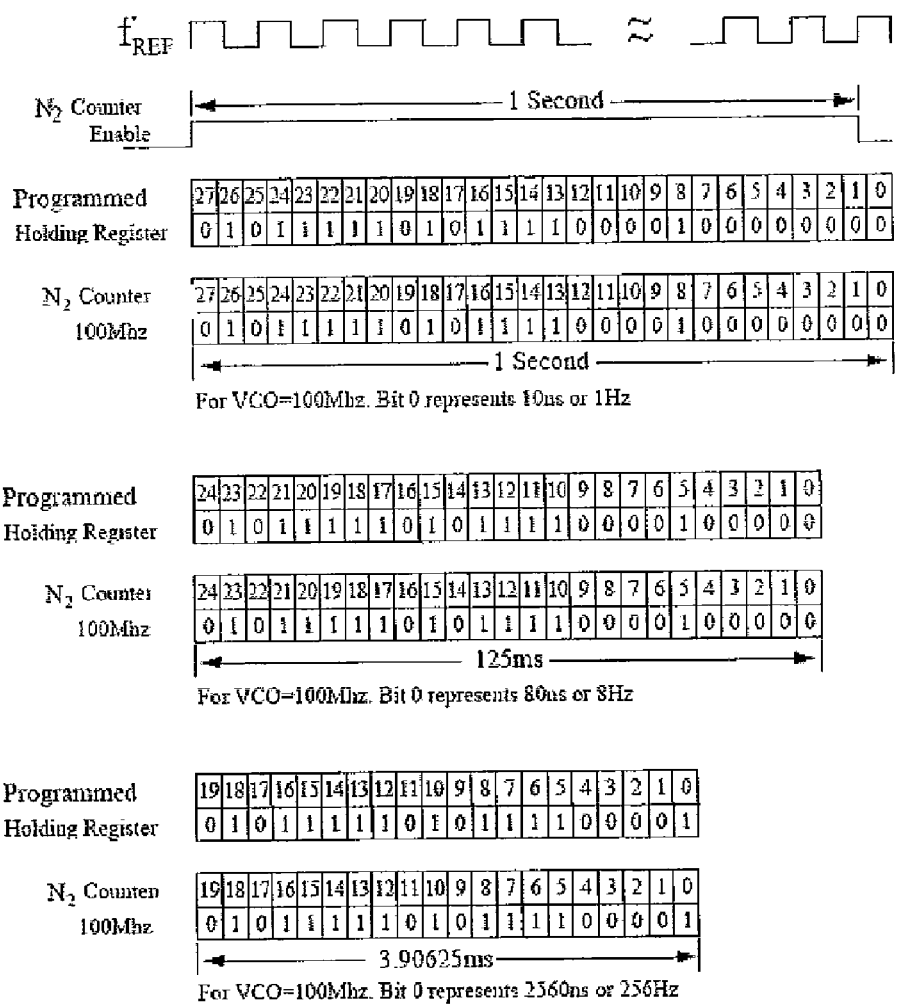
FIG. 7 shows an example of different time base values that produce different resolution of the frequency synthesizer in the present invention.

FIG. 7 shows that the resolution can be adjusted by changing the time base. The better the resolution, the longer the time for N2 counter 11 to take the measurement. Using 100 MHz as an example, for the frequency synthesizer with 1 Hz resolution, the measurement takes one second. For 8 Hz resolution, it takes 125 ms. For 256 Hz resolution, it takes only 3.90625 ms. Consequently the DAC, all the counters and ALU width also become less when the resolution is larger in value. Furthermore, it takes a reasonable size memory to store all the frequency values as shown in FIG. 5.

If the synthesizer is a fixed frequency synthesizer, the size of the memory size is not large. For example, a frequency synthesizer only operates at 98 MHz. If the VCO deviates less than 4 KHz from the target frequency, the memory needs to store only 4,096 values. If the frequency synthesizer is a variable synthesizer and has a range from 90 MHz to 100 MHz, the memory size needs to be 10 million deep and 28 hits wide if the resolution is 1 Hz. If the resolution is 10 Hz then the memory depth is reduced by 10 times.

Figure 8:
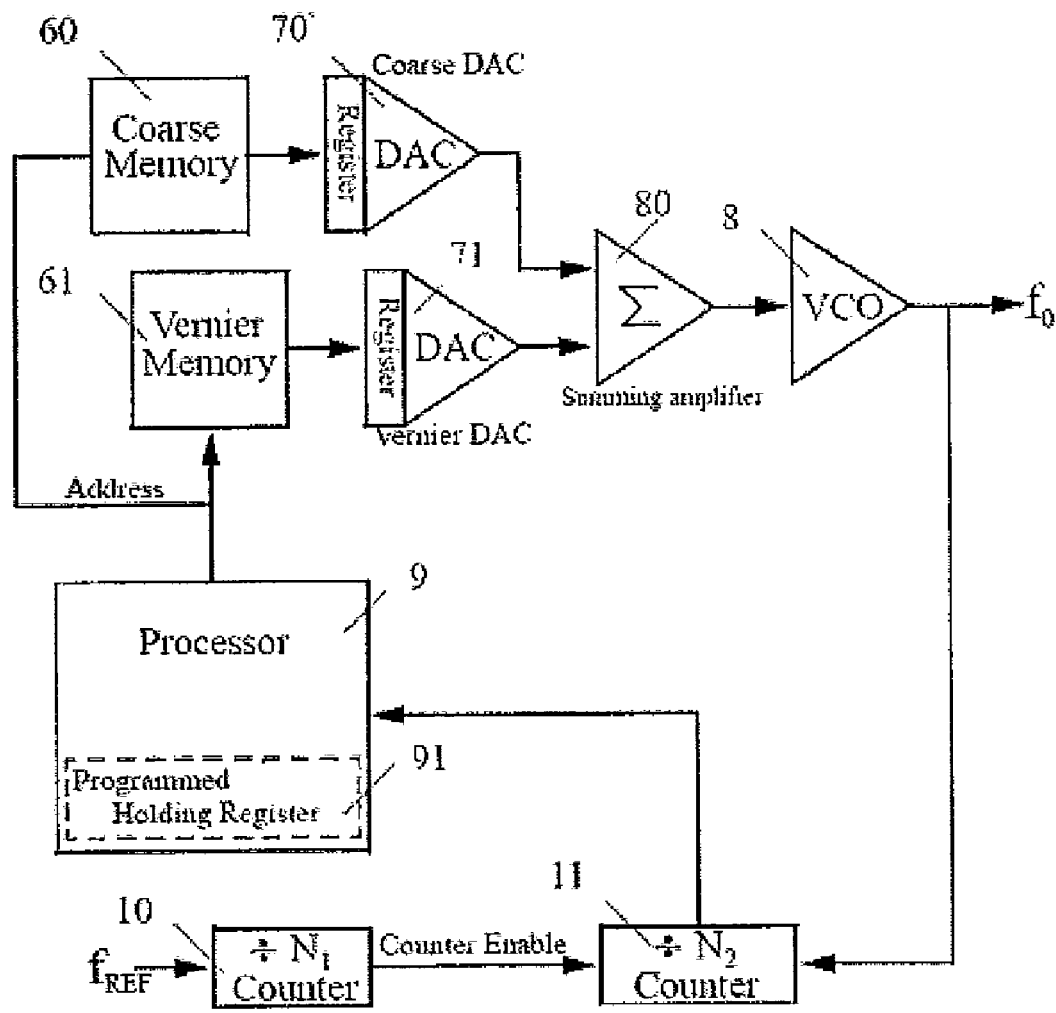
FIG. 8 is a functional block diagram of a DPFL frequency synthesizer according to the present invention of the third embodiment.

With reference to FIG. 8, the functional block diagram of the DPFL frequency synthesizer of the third embodiment according to the present invention includes the coarse memory 60 and the vernier memory 61 instead of the memory 6 in FIG. 5. The DPFL frequency synthesizer further includes the coarse DAC 70 and the vernier DAC 71, which are connected to the coarse memory 60 and the vernier memory 61, respectively, instead of the DAC 7 in FIG. 5.

The summing amplifier 80 is included to add or subtract the output voltage of the vernier DAC 71 to the output voltage of the coarse DAC 70. The LSB voltage of the coarse DAC 70 equals to the full scale of the voltage of the vernier DAC 71 minus one LSB.

Assuming that the address of the coarse memory 60 is 16 bits and the address of the vernier memory 61 is 12 bits, the above example of 90 MHz to 100 MHz frequency synthesizer shows that the vernier memory 61 needs a depth of 4096 to store each coarse frequency. Each value of the frequency stored in the coarse memory 60 is separate by 4096 Hz and the first value starts at 90 MHz. The coarse memory 60 is reduced to a depth of 2442 by 16 bits wide for the frequency range from 90 MHz to 100 MHz. The vernier memory 61 remains the same depth of 10 million by 12 bits wide. 4096 vernier memory locations are needed to support each coarse memory location.

It is not so difficult to search the values for the coarse frequencies because of only 2442 values to be searched. However, it would take a long time to search all the vernier values because the 4096 vernier locations for one coarse frequency may not be the same as another 4,096 vernier locations of the other coarse frequency due to the nonlinearity of the VCO transfer characteristic.

Figure 10:
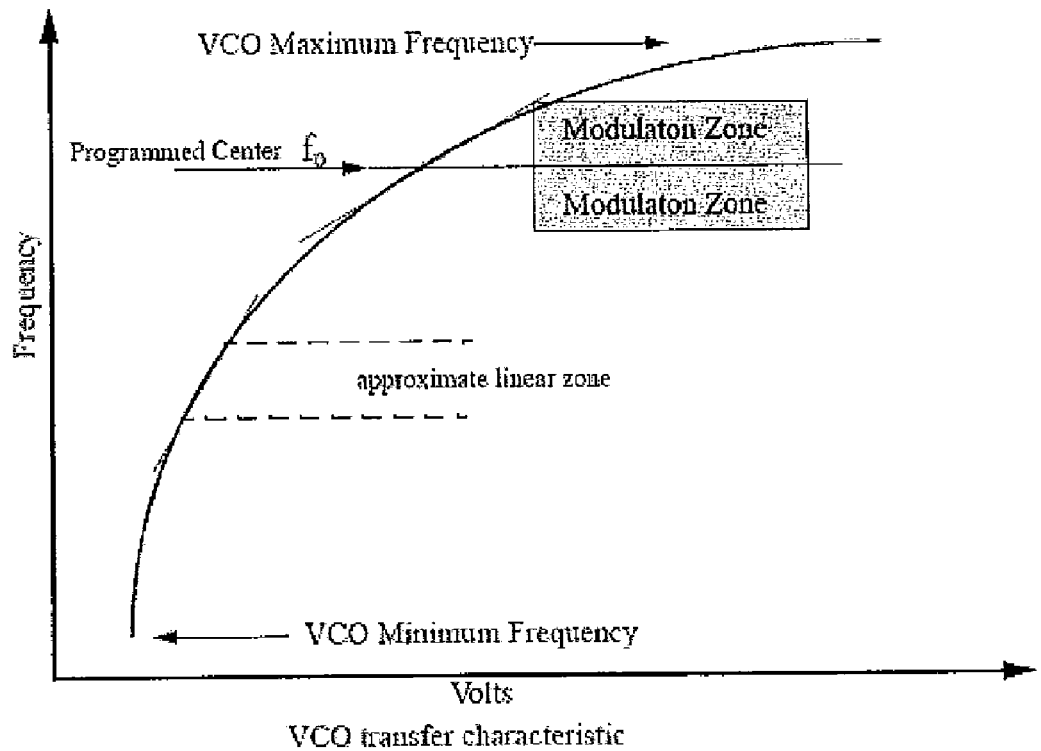
FIG. 10 shows the range of the frequency deviation of the DPFL frequency synthesizer according to the present invention during the frequency modulation.

A faster approach to find the vernier values for different coarse frequency is to approximate the 4096 steps as a linear function using different slope for different coarse frequency as shown in FIG. 10. This linear approximation would eliminate the tedious searching time.

Figure 9:
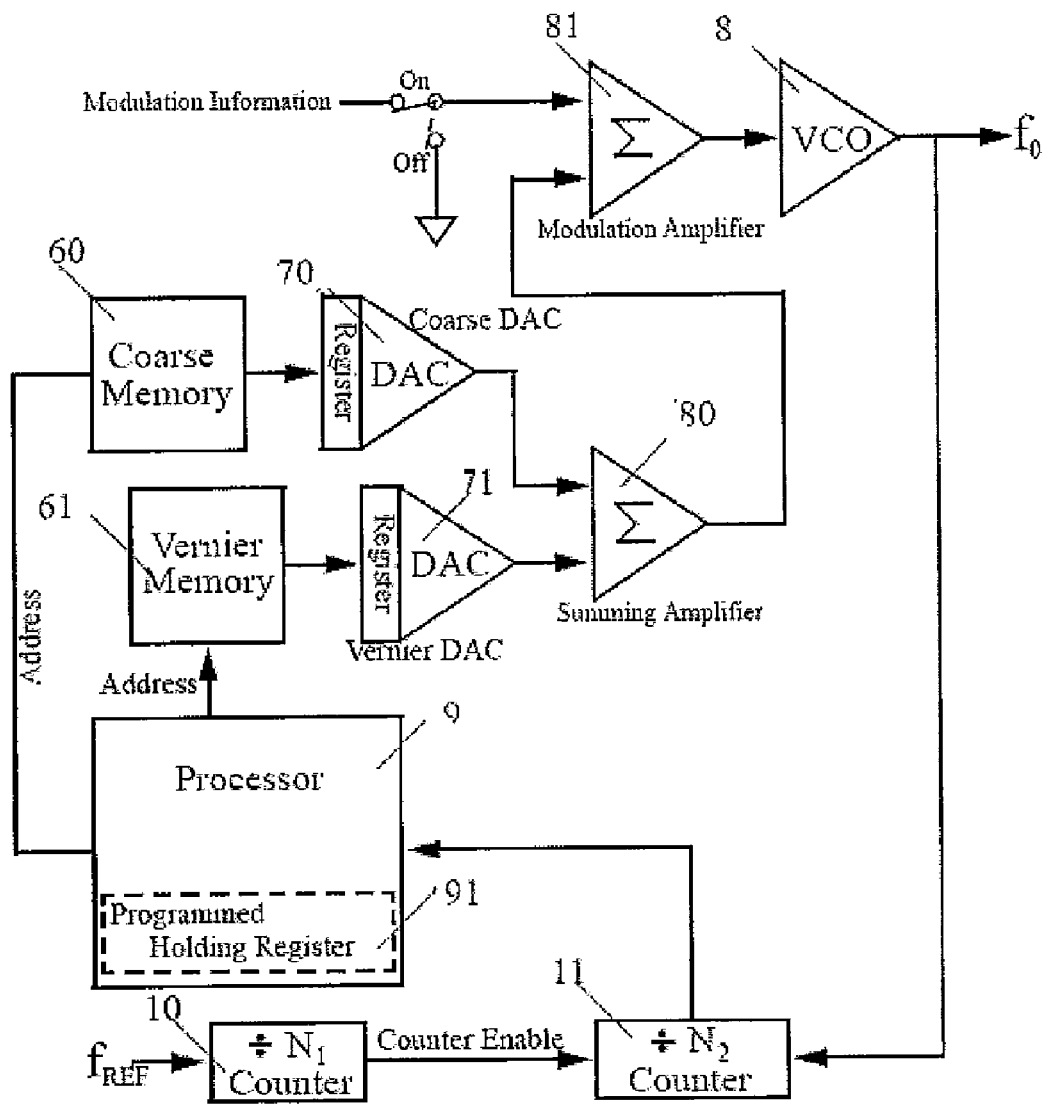
FIG. 9 shows the frequency modulation with the DPFL frequency synthesizer according to the present invention.

FIG. 9 shows another benefit of the DPFL technique of the present invention used in FM modulation. During the t3 time in FIG. 6 when the correction is found and before it drifts off, the Hold/Update input port of the DAC holding register 92 is set in the Hold mode.

By doing so, the DAC holding register 92 is not updated and holds the same address to the memories, and the VCO 8 is driven by the same value. The frequency modulation can take place at this time because the modulation voltage is added to the total sum of the coarse DAC 70 and the vernier DAC 71 by the modulation amplifier 81. By holding off the Hold/Update port of the DAC holding register 92, the changes of the modulation frequency are not being corrected. If the time base of the t2 time is too long, it may interfere into the modulation time, and thus the t2 time can be cut into small segments during the modulation time as t2=t2a+t2b+t2c . . . .

Figure 11:
FIG. 11 shows the modulated carrier frequency of the DPFL frequency synthesizer according to the present invention during the frequency modulation.

FIG. 10 shows the frequency variation when the information is modulated to the carrier frequency. As frequency modulation, the change in the frequency represents the change in volume of the voice or information and the change rate of the carrier frequency represents the frequency of the information, as shown in FIG. 11.

Figure 12:
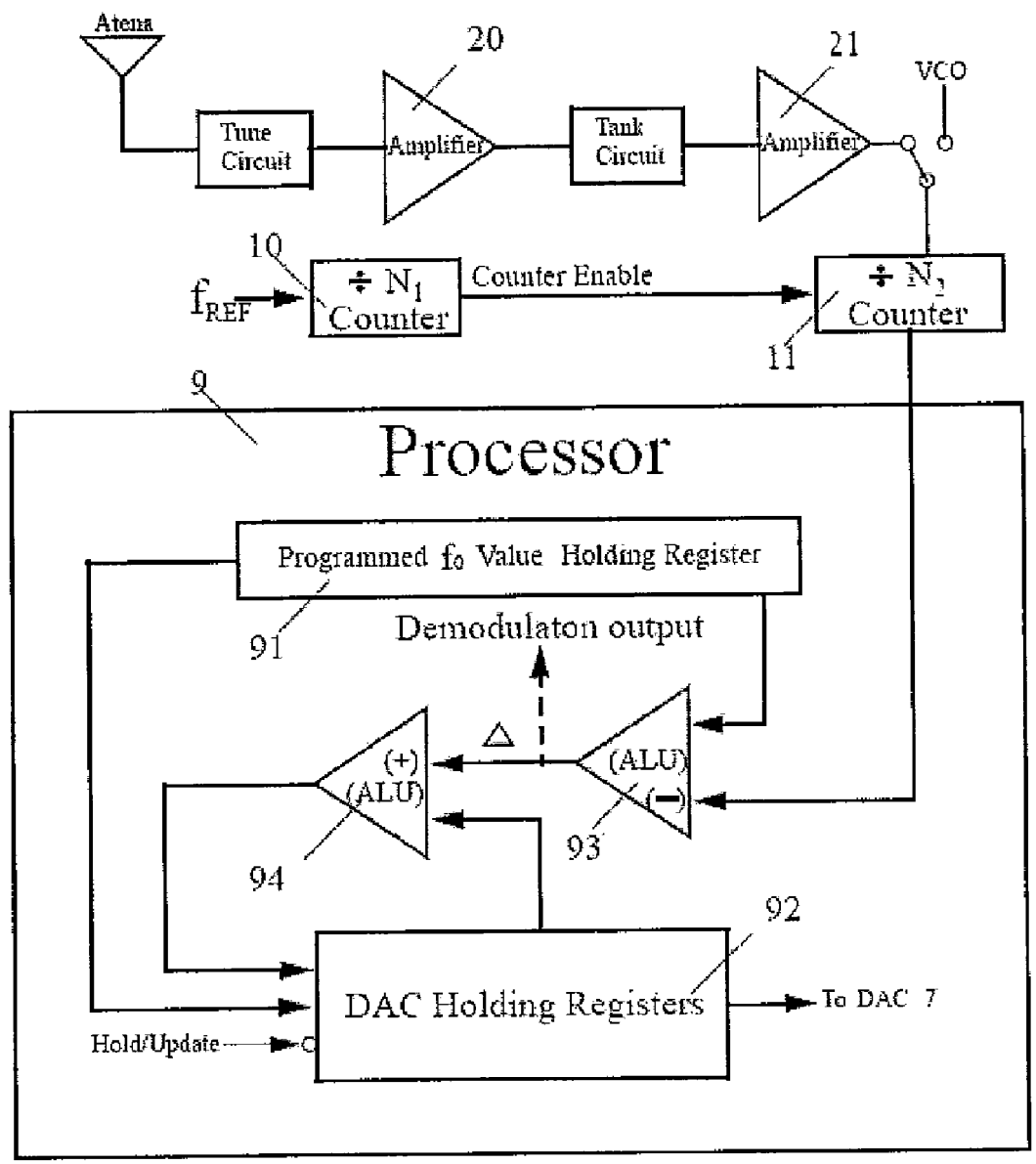
FIG. 12 shows architecture of the FM frequency demodulation with the DPFL frequency synthesizer according to the present invention.

More benefits from the present invention are shown in FIG. 12. The N2 counter 11 is used to measure the modulated FM frequency from the FM receiver which is either IF or RF. The carrier frequency is loaded into the programmed holding register 91. The first ALU 93 subtracts the carrier frequency in the programmed holding register 91 from the modulated frequency. Therefore, the output of the first ALU 93 is the demodulated signal.

With the above detailed description, the present invention is more understandable for those skilled in the prior arts. There are 3 main features for the present invention.

Firstly, in accordance with the present invention, the method of DPFL technique only deals with one variable, which is the frequency, but the PLL frequency technique has two variables, one the phase difference and the other is frequency. Unfortunately, any information for one variable does not relate to the other. As a result of reducing to a single variable, the entire functions of the synthesizer are more predictable.

The control of the synthesizer by digital processing technique can be easily tailored to different applications by changing the control algorithm. The digital processing technique can be applied to the frequency synthesizer that does not require the output frequency to maintain a phase relationship with the reference frequency.

Secondly, the DPFL technique of the present invention does not use phase detector and the frequency resolution of the synthesizer is programmable. However, the phase detector used in the PLL technique has certain input resolving power.

Thirdly, the DPFL technique of the present invention does not have an automatic feedback loop but waits for the VCO to settle. Frequency begin capture time is controlled by the processor. There is no uncertain frequency being captured. In the PLL technique the VCO output divider is continuously counting even while the charge pump is being charged. Therefore, the output frequency is changing while the charge pump is charging and the output frequency divider may capture some uncertain frequencies.

While the invention has been particularly shown and described with reference to preferred embodiments thereof, it will be understood by those skilled in the art that the foregoing and the other changes in form and details may be made therein without departing from the spirit and the scope of the invention.

What is claimed is:

1. A frequency synthesizer having a reference frequency as an input signal and an output frequency as an output signal, the frequency synthesizer comprising:

an N1 counter for dividing said reference frequency by a number of N1, and delivering an enable signal;

an N2 counter for receiving said enable signal, dividing said output frequency by a number of N2 when said enable signal is active, and delivering a digital output data;

a processor for receiving said output data of said N2 counter and delivering a digital output data;

a digital to analog converter (DAC) for receiving and converting said output data of said processor and delivering an analog output signal; and a voltage control oscillator (VCO) for receiving said output signal of said DAC and delivering said output frequency;

wherein said DAC comprises a DAC register for storing said output data of said processor for said DAC to generate said output signal.

2. The frequency synthesizer as claimed in claim 1, wherein said enable signal is active for said N2 counter when said enable signal is a high logic level, and said enable signal is inactive for said N2 counter when said enable signal is a low logic level.

3. The frequency synthesizer as claimed in claim 1, wherein said enable signal is active for said N2 counter when said enable signal is a low logic level, and said enable signal is inactive for said N2 counter when said enable signal is a high logic level.

4. The frequency synthesizer as claimed in claim 1, wherein said processor comprises:

a programmed holding register for storing a target frequency programmed by an external control device and delivering an output data;

a DAC holding register for receiving said output data of said programmed holding register, and delivering an output data coupled to said output data of said processor;

a first arithmetic logic unit (ALU) for subtracting said output data of said N2 counter from said output data of said programmed holding register, and delivering an output data; and a second ALU for adding said output data of said DAC holding register to said output data of said first ALU, and delivering an output data coupled to said DAC holding register;

wherein said DAC holding register further comprises an input Hold/Update port to set said DAC holding register in a Hold or Update mode; and said output data of said DAC holding register is not changed in said Hold mode.

5. The frequency synthesizer as claimed in claim 1, wherein said N1 counter is a fixed counter.

6. The frequency synthesizer as claimed in claim 1, wherein said N1 counter is a programmable counter.

7. A frequency synthesizer having a reference frequency as an input signal and an output frequency as an output signal, the frequency synthesizer comprising:

an N1 counter for dividing said reference frequency by a number of N1 and delivering an enable signal;

an N2 counter for receiving said enable signal from said N1 counter, dividing said output frequency by a number of N2 when said enable signal is active, and delivering an output data;

a processor for receiving said output data of said N2 counter and delivering an output data;

a memory for receiving said output data of said processor and delivering an output data;

a digital to analog converter (DAC) for receiving and converting said output data of said memory and delivering an analog output signal; and a voltage control oscillator (VCO) for receiving said output signal of said DAC and delivering said output frequency;

wherein said DAC comprises a DAC register for storing said output data of said memory for said DAC to generate said output signal.

8. The frequency synthesizer as claimed in claim 7, wherein said enable signal is active for said N2 counter when said enable signal is a high logic level, and said enable signal is inactive for said N2 counter when said enable signal is a low logic level.

9. The frequency synthesizer as claimed in claim 7, wherein said enable signal is active for said N2 counter when said enable signal is a low logic level, and said enable signal is inactive for said N2 counter when said enable signal is a high logic level.

10. The frequency synthesizer as claimed in claim 7, wherein said processor comprises:
a programmed holding register for storing a value of a target frequency programmed by an external control device and delivering an output data;
a DAC holding register for receiving said output data of said programmed holding register, and delivering an output data coupled to said output signal of said processor;
a first arithmetic logic unit (ALU) for subtracting said output data of said N2 counter from said output data of said programmed holding register, and delivering an output data; and
a second ALU for adding said output data of said DAC holding register to said output data of said first ALU, and delivering an output data to said DAC holding register;
wherein said DAC holding register further comprises an input Hold/Update port to set said DAC holding register in a Hold or Update mode; and said output data of said DAC holding register is not changed in said Hold mode.

11. The frequency synthesizer as claimed in claim 7, wherein said DAC holding register is initially set in said Hold mode, said DAC register is not changed by said output data of said memory, and said external control device writes an initial value to said DAC register as said target frequency;
said DAC generates said output signal, and said VCO generates said output frequency;
said output frequency is divided and counted by said N2 counter to generate said output data as a measured frequency for said output frequency;
said measured frequency of said N2 counter is checked by said external control device if said output frequency matches said value stored in said programmed holding register as said target frequency;
said output data of said DAC holding register coupled to said memory is not changed when said output signal of said N2 counter changes because said DAC holding register is in said Hold mode;
said DAC register keeps loading a new data from said external control device and said DAC, VCO, and N2 counter perform said same operation until said output frequency matches said value stored in said programmed holding register;
said DAC register is fetched by said external control device to obtain a frequency corrected data;
said output data of said processor is coupled to said memory as a memory address of said memory, said frequency corrected data is a memory write data of said memory, and said memory is written with said memory address and said memory write data by said external control device; and said DAC holding register is set in said Update mode after all frequency corrected data are stored in said memory, said DAC register is updated by said output data of said memory, and said output frequency generated by said VCO matches said target frequency as specified in said programmed holding register by said external control device.

12. The frequency synthesizer as claimed in claim 7, wherein said N1 counter is a fixed counter.

13. The frequency synthesizer as claimed in claim 7, wherein said N1 counter is a programmable counter.

14. The frequency synthesizer as claimed in claim 7, wherein said memory and said DAC are replaced by a coarse memory, a coarse DAC, a vernier memory, a vernier DAC, and a summing amplifier;
said coarse memory receives said output signal from said processor and delivers an output signal coupled to said coarse DAC;
said vernier memory receives said output signal from said processor and delivers an output signal coupled to said vernier DAC;
said coarse DAC delivers an output signal coupled to said summation amplifier;
said vernier DAC delivers an output signal coupled to said summing amplifier;
an LSB voltage of said coarse DAC equals to a full scale of said vernier DAC minus one LSB;
said summing amplifier receives and sums up the output signals from said coarse DAC and said vernier DAC to obtain a summed signal, said summed signal is amplified, and said summing amplifier delivers an output signal coupled to said VCO.

15. The frequency synthesizer as claimed in claim 7, wherein said memory and said DAC are replaced by a coarse memory, a coarse DAC, a vernier memory, a vernier DAC, a summing amplifier, and a modulation amplifier;
said coarse memory receives said output signal from said processor and delivers an output signal coupled to said coarse DAC;
said vernier memory receives said output signal from said processor and delivers an output signal coupled to said vernier DAC;
said coarse DAC delivers an output signal coupled to said summation amplifier;
said vernier DAC delivers an output signal coupled to said summation amplifier;
an LSB voltage of said coarse DAC equals to a full scale of said vernier DAC minus one LSB;
said summing amplifier receives and sums up the output signals from said coarse DAC and said vernier DAC to obtain a summed signal, and said summed signal is amplified and said summing amplifier delivers an output signal coupled to said modulation amplifier;
said modulation amplifier sums up and amplifies said output signal of said summation amplifier and a modulation information signal to generate an output signal coupled to said VCO;
said DAC holding register is set to said Hold mode after said VCO is settled and before said output frequency drifts off to keep said summed signal, and said output frequency of said VCO modulated by said modulation information signal.

16. The frequency synthesizer as claimed in claim 15, wherein said programmed holding register is loaded with a carrier frequency of a modulated frequency modulation (FM) signal from an external signal source, said N2 counter receives and measures said modulated FM signal to deliver a modulated frequency, said first ALU subtracts said carrier frequency in said programmed holding register from said modulated frequency to deliver a demodulated signal.

17. A method for constructing a frequency synthesizer having an N1 counter, an N2 counter, a processor, a DAC, and a VCO, the method comprising the steps of:
inputting a reference frequency to said N1 counter as a time base for said frequency synthesizer;
driving said N1 counter to generate an enable signal by dividing said reference frequency by a number of N1;
driving said N2 counter to generate an output data coupled to said processor by dividing an output frequency of said VCO by a number of N2 when said enable signal is active;
driving said processor to generate an output data coupled to a DAC register of said DAC;
driving said DAC to generate an analog output signal coupled to a VCO by said output data of said DAC register; and
driving said VCO to generate said output frequency coupled to said N2 counter.

18. The method as claimed in claim 17, wherein said enable signal is active for said N2 counter when said enable signal is a high logic level, and said enable signal is inactive for said N2 counter when said enable signal is a low logic level.

19. The method as claimed in claim 17, wherein said enable signal is active for said N2 counter when said enable signal is a low logic level, and said enable signal is inactive for said N2 counter when said enable signal is a high logic level.

20. The method as claimed in claim 17, wherein said N1 counter is a fixed counter.

21. The method as claimed in claim 17, wherein said N1 counter is a programmable counter.

22. The method as claimed in claim 17, wherein said processor comprises:
a programmed holding register for storing a value of a target frequency programmed by an external control device and delivering an output data;
a DAC holding register for delivering an output data coupled to said output signal of said processor;
a first arithmetic logic unit (ALU) for subtracting said output signal of said N2 counter from said output data of said programmed holding register and delivering an output data; and
a second ALU for adding said output data of said DAC holding register to said output data of said first ALU and delivering an output data to said DAC holding register;
wherein said DAC holding register further comprises an input Hold/Update port to set said DAC holding register in a Hold or Update mode; and said output data of said DAC holding register is not changed in said Hold mode.

23. A method for constructing a frequency synthesizer having an N1 counter, an N2 counter, a processor, a memory, a DAC, and a VCO, the method comprising the steps of:
inputting a reference frequency to said N1 counter as a time base for said frequency synthesizer;
driving said N1 counter to generate an enable signal by dividing said reference frequency by a number of N1;
driving said N2 counter to generate an output data coupled to said processor by dividing an output frequency by a number of N2 when said enable signal is active;
driving said processor to generate an output data coupled to said memory as a memory address;
driving said memory to generate an output data coupled to a DAC register of said DAC;
driving said DAC to generate an analog output signal coupled to a VCO by said output data of said DAC register; and
driving said VCO to generate said output frequency coupled to said N2 counter.

24. The method as claimed in claim 23, wherein said processor comprises:
a programmed holding register for storing a value of a target frequency programmed by an external control device and delivering an output data;
a DAC holding register for receiving said output data of said programmed holding register, and delivering an output data coupled to said output signal of said processor;
a first arithmetic logic unit (ALU) for subtracting said output data of said N2 counter from said output data of said programmed holding register, and delivering an output data; and
a second ALU for adding said output data of said DAC holding register to said output data of said first ALU, and delivering an output data to said DAC holding register;
wherein said DAC holding register further comprises an input Hold/Update port to set said DAC holding register in a Hold or Update mode; and said output data of said DAC holding register is not changed in said Hold mode.

25. The method as claimed in claim 23, further comprising the steps of:
switching said DAC holding register of said processor to said Hold mode;
writing a value of said target frequency to said programmed holding register and said DAC register;
checking if said output frequency of said VCO matches said value stored in said programmed holding register as said target frequency;
loading a new value to sad DAC register and perform all operations for said DAC, VCO, and N2 counter until said output frequency matches said value stored in said programmed holding register;
reading said value stored in said DAC register and writing to said memory;
specifying a value of a new target frequency to said programmed holding register and said DAC register, and performing all operations for said N2 counter, processor, memory, DAC, and VCO until all values of target frequency are processed; and
switching said DAC holding register to said Update mode for normal frequency synthesizing operation according to said target frequency stored in said programmed holding register.

* * * * *